United States Patent [19]

Hayashibara

[11] Patent Number: 5,406,508

[45] Date of Patent: Apr. 11, 1995

[54] CONTENT ADDRESSABLE MEMORY AND METHOD OF USE THEREOF

[75] Inventor: Izumi Hayashibara, Tokyo, Japan

[73] Assignee: Kawasaki Steel Corporation, Hyogo, Japan

[21] Appl. No.: 127,523

[22] Filed: Sep. 28, 1993

[30] Foreign Application Priority Data

Sep. 30, 1992 [JP] Japan ................. 4-261487

[51] Int. Cl.⁶ ............................................. G11C 15/00
[52] U.S. Cl. ................................. 365/49; 395/24
[58] Field of Search ............. 365/49; 307/201; 395/27, 24

[56] References Cited

U.S. PATENT DOCUMENTS

| | | | |
|---|---|---|---|
| 4,385,371 | 5/1983 | Shafer et al. | 365/49 |
| 4,670,858 | 6/1987 | Almy | 365/49 |
| 4,890,260 | 12/1989 | Chuang et al. | 365/49 |
| 4,897,814 | 1/1990 | Clark | 395/27 |
| 4,999,525 | 3/1991 | Park et al. | 395/24 |
| 5,204,549 | 4/1993 | Platt et al. | 395/24 |
| 5,237,210 | 8/1993 | Castro | 395/24 |

OTHER PUBLICATIONS

Robinson et al., "A Modular VLSI Design of a CMOS Hamming Network", *Proc. International Symposium Circuits and Systems,* Jun. 1991, pp. 1920–1923.

*Primary Examiner*—Eugene R. LaRoche
*Assistant Examiner*—Son Dinh
*Attorney, Agent, or Firm*—Oliff & Berridge

[57] ABSTRACT

In a content addressable memory, a plurality of non-volatile memory cells each are provided in conjunction with the associated one of a plurality of match lines, thresholds of the plurality of non-volatile memory cells are selectively altered on the basis of a teacher-signal, and in read out of data, selected is a match line associated with a non-volatile memory cell having a maximum weight, if the match signal appears on a plurality of match lines, the thresholds of the non-volatile memory cells being treated as the weights, thereby reading out data which has been stored in the word memory involved in the maximum weight.

8 Claims, 8 Drawing Sheets

ADDRESS SIGNAL AD

PRIOR ART

Ken

| Ken | 県 |
| Ken | 件 |
| Ken | 権 |
| Ken | 検 |
| Ken | 券 |

Fig. 7

PRIOR ART

Fig.8

CONTENT ADDRESSABLE MEMORY AND METHOD OF USE THEREOF

BACKGROUND OF THE INVENTION

1. Field of the Invention

The present invention relates to a content addressable memory or an associative memory comprising a number of word memories each for storing digital data in units of words, and having such a function that retrieval data are input to the word memories and the word memories, which have stored digital data having a bit pattern coincident with that of the retrieval data in its entirety or in a part specified, are retrieved, and further relates a method of the use of the content addressable memory.

2. Description of the Related Art

Recently, there has been proposed a content addressable memory or an associative memory provided with the retrieval function as mentioned above.

Figure 6:
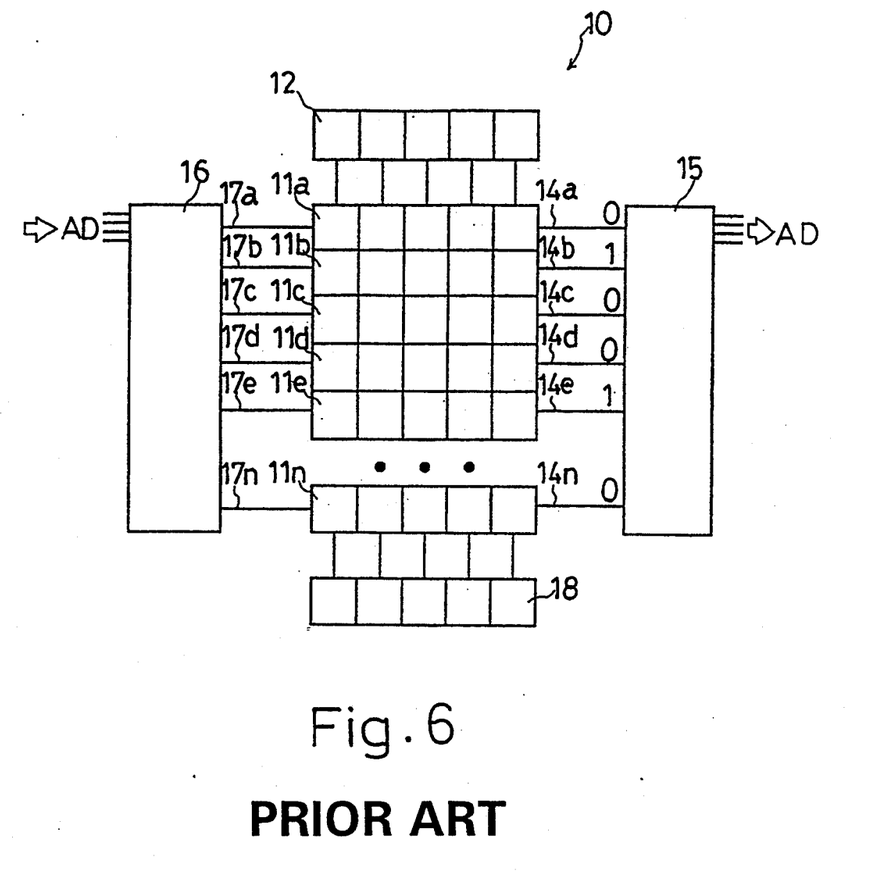
FIG. 6 is a circuit diagram of a content addressable memory according to the prior art by way of example.

FIG. 6 is a circuit block diagram of the conventional content addressable memory by way of example.

Referring to FIG. 6, a content addressable memory 10 is provided with a number of word memories 11a, 11b, ..., 11n each consisting of a 5-bits serial memory. Further, the content addressable memory 10 comprises a retrieval register 12 which is adapted to latch a word of retrieval data when it is entered the retrieval register 12. A bit pattern of the retrieval data latched in the retrieval register 12 in its entirety or in a part specified is compared with a bit pattern of the portion corresponding to the bit pattern of the latched retrieval data with respect to data stored in each of the word memories 11a, 11b, ..., 11n. As a result of the comparison, if there are found any of the word memories 11a, 11b, . . ., 11n of which the bit pattern is coincident with that of the retrieval data, a match signal given by a logic "1" (here 5.0 volt) will appear on the associated ones of match lines 14a, 14b, ..., 14n which are provided in conjunction with the word memories 11a, 11b, ..., 11n, respectively. On the other hand, a mismatch signal given by a logic "0" will appear on the remaining ones of the match lines 14a, 14b, ..., 14n.

Assuming that the signals "0", "1", "0", "0", "1" ... , "0" appear on the flag lines 14a, 14b, ..., 14n, respectively, these signals are applied to a priority encoder 15. The priority encoder 15 is so arranged as to output an address signal corresponding to the highest priority match line given with a highest priority among the match lines (here, the match lines 14b and 14e) on which the match signal given by a logic "1" appears. Supposing that the priority is higher as alphabet of a suffix of the reference character becomes younger, in this case, the match line 14b is selected as the highest priority match line. Thus, the priority encoder 15 outputs an address signal AD corresponding to the highest priority match line 14b, which address signal AD is passed to an address decoder 16. The address decoder 16 decodes the received address signal AD and outputs an access signal (here a signal given by a logic "1" to the associated one (here a word line 17b) of word lines 17a, 17b, ..., 17n which are provided in conjunction with the word memories 11a, 11b, ..., 11n, respectively. Thus, data stored in the word memory 11b associated with the word line 17b on which the access signal appears is read out to an output register 18 and latched therein.

If the data read out in this way is not a desired one, the match line 14b is masked by means of entry of such information so that the associated signal on the flag line 14b is changed from the logic "1" to the logic "0". Thus, the match line 14e serves now as the highest priority match line, so that data stored in the associated word memory 11e is read out to the output register 18.

As described above, according to the content addressable memory 10, the contents or data stored in a number of word memories 11a, 11b, . . . , 11n are retrieved using the retrieval data in its entirety or a part specified, so that an address of the word memory corresponding to the match data is generated, and thus it is possible to read out the whole data stored in the word memory.

The content addressable memory arranged in such a way as mentioned above, however, may be associated with the following drawbacks in a case where a match signal "1" appears on a number of match signal lines.

Figure 7:
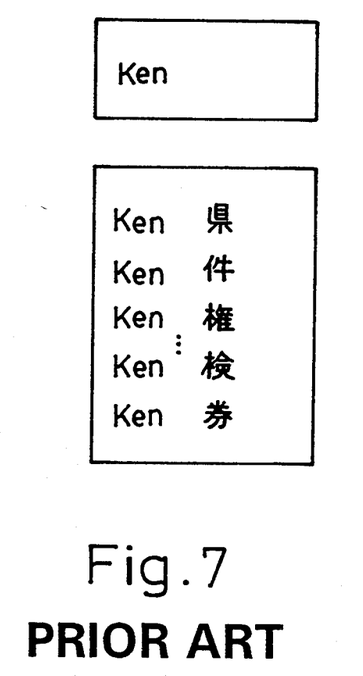
FIG. 7 is a view useful for explanation of the drawbacks of the conventional content addressable memory.

FIG. 7 is a view useful for explanation of the drawbacks in such a case.

It is assumed that when a data retrieval is carried out using "ken" as a retrieval data, five match data as shown in FIG. 7 are obtained. Incidentally, it is noted that the five Chinese characters "県", "件", "権", "検", "券" are pronounced in Japanese as [ken], but they are mutually different in meaning. Supposing that the priority is given in the named order as shown in the figure and a desired data is "ken検", it is informed that first read out data "ken県" is not a desired one, next, it is informed that second read out data "ken件" is also not a desired one, and the similar operation is repeatedly performed until a desired data "ken検" is located. This procedure takes much time for the data retrieval.

SUMMARY OF THE INVENTION

In view of the foregoing, it is therefore an object of the present invention to provide a content addressable memory in which word memories are adapted to be given with weights, and the storage contents of the word memories associated with the match lines on which a match signal appears can be read out in order of weight.

The content addressable memory according to the present invention basically comprises: a plurality of word memories each for storing digital data in units of words; a data retrieval circuit adapted to receive retrieval data and to output match signals to match lines associated with word memories each storing a bit pattern coincident with that of the retrieval data in its entirety or in a part specified, among a plurality of match lines each provided in conjunction with the associated one of said plurality of word memories; a plurality of weight memory circuits each provided in conjunction with the associated one of said plurality of match lines; a weight alteration circuit for selectively altering weights stored in said plurality of weight memory circuits in accordance with a predetermined teacher-signal; and a selection circuit for selecting a match line associated with a weight memory circuit having a maximum weight, if the match signal appears on a plurality of match lines, among a plurality of weight memory circuits associated with said plurality of match lines on which the match signal appears.

While the content addressable memory according to the present invention may be arranged in such a way that as the weight memory circuit, for example, a counter is used, and as the weight alteration circuit, a circuit is used for altering a count value of the counter as mentioned above on the basis of the teacher-signal, it may also be arranged by means of efficiently utilizing non-volatile memories. More specifically, in the content addressable memory utilizing the non-volatile memories according to the present invention, each of said plurality of weight memory circuits has a non-volatile memory cell provided in conjunction with the associated one of said plurality of match lines, said weight alteration circuit selectively alters thresholds of the plurality of non-volatile memory cells, and said selection circuit selects a match line associated with a non-volatile memory cell having a maximum weight, if the match signal appears on a plurality of match lines, among a plurality of non-volatile memory cells associated with said plurality of match lines on which the match signal appears, the thresholds of the non-volatile memory cells being treated as the weights.

Further, in the content addressable memory utilizing the non-volatile memories according to the present invention, said weight alteration circuit performs selectively a repeated erase on a unit time basis of arbitrary numbers of said plurality of non-volatile memory cells which have been subjected to writing to a predetermined level.

The method of using a content addressable memory according to the present invention is characterized in that prepared is the content addressable memory comprising: a plurality of word memories each for storing digital data in units of words; a data retrieval circuit adapted to receive retrieval data and to output match signals to match lines associated with word memories each storing a bit pattern coincident with that of the retrieval data in its entirety or in a part specified, among a plurality of match lines each provided in conjunction with the associated one of said plurality of word memories; a plurality of weight memory circuits each provided in conjunction with the associated one of said plurality of match lines; a weight alteration circuit for selectively altering weights stored in said plurality of weight memory circuits in accordance with a predetermined teacher-signal; and a selection circuit for selecting a match line associated with a weight memory circuit having a maximum weight, if the match signal appears on a plurality of match lines, among a plurality of weight memory circuits associated with said plurality of match lines on which the match signal appears, and the method of using said content addressable memory comprises the steps of: inputting the retrieval data into said content addressable memory to output therefrom a retrieval result corresponding to the entered retrieval data; requiring said content addressable memory to output another retrieval result in the next sequence when the obtained retrieval result is not a desired one; and inputting the predetermined teacher-signal into said content addressable memory, when the obtained retrieval result is a desired one, and causing a weight memory circuit associated with a word memory storing data corresponding to the desired retrieval result to store therein a weight greater than the weight having been stored in said weight memory circuit by replacement. Hitherto, the priority encoder is generally fixed in priority order. Otherwise, speaking strictly, there is known a priority encoder so arranged that the priority order can be changed. However, according to such a priority encoder, it is simply permitted to select any one from among 2 or 3 ways of priority order which are previously specified, for example, in such a way that the upper a word memory is in the address space in accordance with the arrangement order of a plurality of word memories, the higher a priority order is, or the lower a word memory is in the address space with respect to the arrangement order of a plurality of word memories, the higher a priority order is. Thus, it would be impossible to optionally to change the priority order.

On the contrary, according to the present invention, the content addressable memory is arranged in such a way that a plurality of weight memory circuits are provided, and a weight alteration circuit selectively alters weights stored in the plurality of weight memory circuits in accordance with a predetermined teacher-signal, so as to output a retrieval result corresponding to the weight memory circuit storing the maximum weight. Thus, it is possible, even if there exist a plurality of retrieval results corresponding to the entered retrieval data, to more quickly obtain a desired retrieval result in comparison with a case where the priority encoder, which is fixed in priority order, is employed.

Now, there will be explained an aspect of the present invention in which non-volatile memories are adopted in the content addressable memory.

Hitherto, there has been used an electrically erasable non-volatile memory cell (EEPROM, flash EPROM and the like) using technology referred to as an MNOS, an MONOS and the like. According to such a memory cell, a threshold voltage of a gate, at which the storage element switches over from a turn-off state to a turn-on state, goes up or down by means of injection of electrons into an electrically insulated thin film or a gate electrode, which injection will be referred to as "write" hereinafter, or ejection of electrons from such a thin film or the gate electrode, which ejection will be referred to as "erase" hereinafter. This feature as to going up and down of the threshold voltage is utilized for information recording. The threshold voltage is varied also depending on the write time and the erase time. Thus, it is possible to switch over to various threshold voltages. Here, it will be explained by way of example such a case that the threshold voltage is varied by means of controlling the erase time or the number of times in erase.

Figure 8:
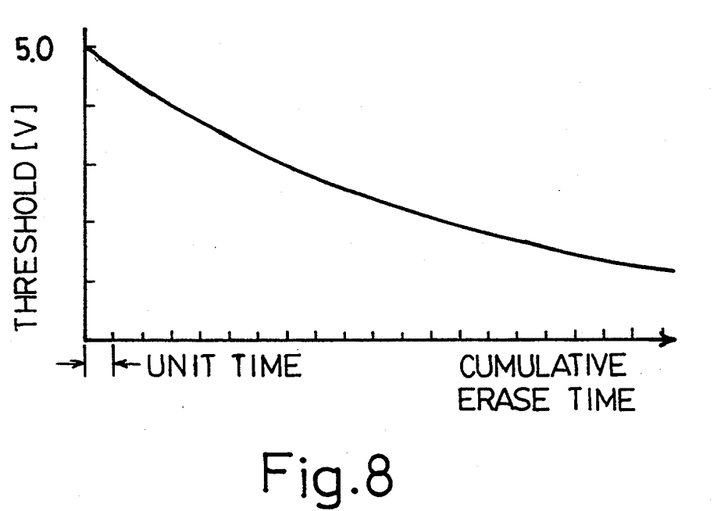
FIG. 8 is a graph which exemplarily shows a variation of the threshold according to the number of times erase.

FIG. 8 is a graph which exemplarily shows a variation of the threshold according to the number of times in erase. First, in an initial setting, a sufficient writing is performed so that the threshold is given with 5.0 V, where what is meant by the threshold is an output voltage of a threshold read out circuit connected to the non volatile memory.

Thereafter, the erasing is performed by a unit time shown in the figure per once. This erasing in a unit time makes the threshold to be for example 0.93 times as large as that before erasing. Thus, the threshold is determined in accordance with the number of times in erase (cumulative erase time).

In the content addressable memory utilizing the non-volatile memories according to the present invention, a plurality of non-volatile memory cells each are provided in conjunction with the associated one of a plurality of match lines, thresholds of the plurality of non-volatile memory cells are selectively altered on the basis of a teacher-signal (for example, a signal indicative of information such that the read out data is a desired one or not desired one), and in read out of data, selected is a match line associated with a non-volatile memory cell having a maximum weight, if the match signal appears on a plurality of match lines, among a plurality of non-volatile memory cells associated with said plurality of match lines on which the match signal appears, the thresholds of the non-volatile memory cells being treated as the weights, thereby reading out data which has been stored in the word memory associated with the selected match line. Thus, it is possible to enhance a retrieval speed. Incidentally, if the data stored in the word memory associated with the selected match line is not a desired one, it may be processed in a similar fashion as in case of the conventional content addressable memory.

For example, such information is informed in form of the teacher-signal and the selected match line is masked so as to inhibit the match signal from appearing thereon, thereby reading out data which has been stored in the word memory corresponding to the next order of weight. At that time, the weight may be altered on the basis of the teacher-signal.

As described above, in the content addressable memory according to the present invention, a number of weight memory circuits such as non-volatile memory cells each are provided in conjunction with the associated one of a number of match lines, weights of the weight memory circuits are selectively altered on the basis of a teacher-signal, and in read out of data, read out is data stored in the word memory associated the weight memory circuit storing a maximum weight, if the match signal appears on a plurality of match lines, among the weights stored in the weight memory circuits, thereby reading out in weight order the storage content of the word memory associated with the match line on which the match signal appears. Thus, it is possible to enhance a retrieval speed.

DESCRIPTION OF THE PREFERRED EMBODIMENTS

Hereinafter, there will be described embodiments of the present invention.

Figure 1:
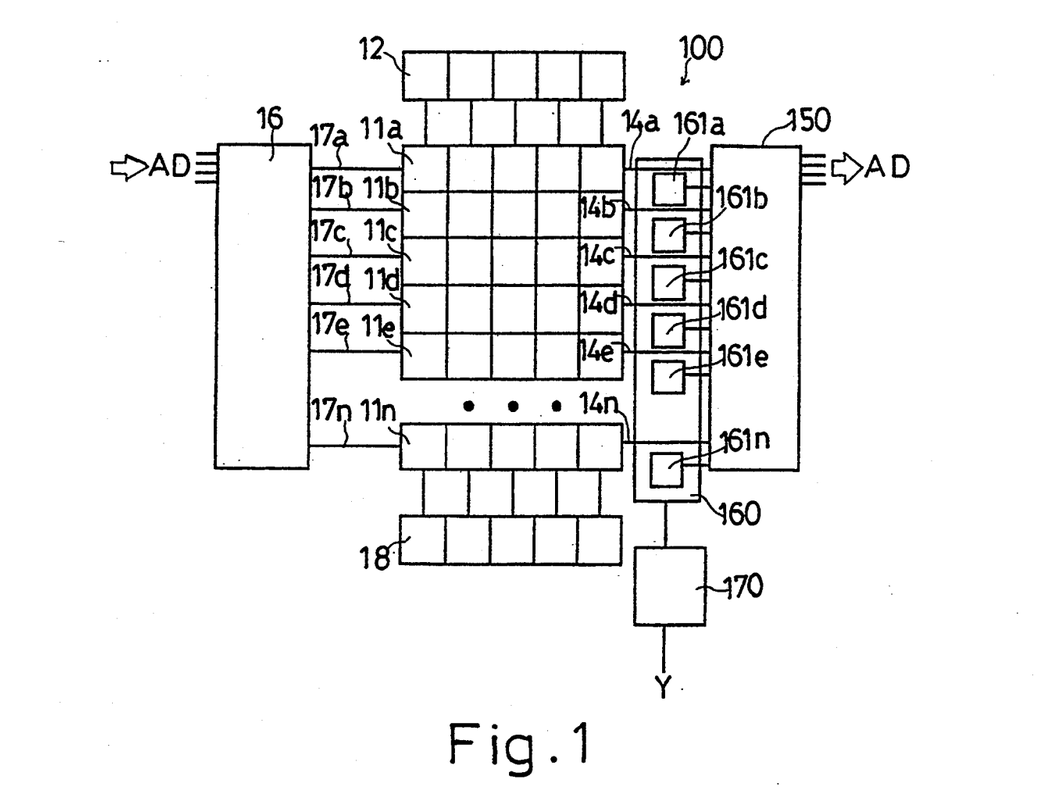
FIG. 1 is a circuit diagram of a content addressable memory according to an embodiment of the present invention.

FIG. 1 is a circuit diagram of a content addressable memory according to an embodiment of the present invention.

In FIG. 1, the same parts are denoted by the same reference numbers as those of FIG. 6.

A content addressable memory 100 is provided with a weighting circuit 160 having weight memory circuits 161a, 161b, ..., 161n each comprising a non-volatile memory cell and the accessory circuits, which are provided in conjunction with the match lines 14a, 14b, ..., 14n, respectively. The content addressable memory 100 is further provided with a memory cell controller 170, which serves as the weight alteration circuit, for controlling write-in and erase of the non-volatile memory cells in the weight memory circuits 161a, 161b, ..., 161n. The memory cell controller 170 performs, in an initial setting, writing for all the non-volatile memory cells so that threshold signals Vth0, Vth1, ..., Vthn (see FIG. 2), which are read out from the weight memory circuits 161a, 161b, ..., 161n, respectively, are given with 5.0 V, and then performs selectively with respect to the non volatile memory cells the erasing by a unit time specified per once. Applied from the outside to the memory cell controller 170 is a teacher-signal Y which is indicative of information such that the data read out onto an output register 18 in a manner as will be described later is a desired one. At the time when the teacher-signal Y is applied, the erasing is carried out by a unit time with respect to the non-volatile memory cell associated with a memory word (e.g. word memory 11b) which stores the data read out onto the output register 18.

Figure 2:
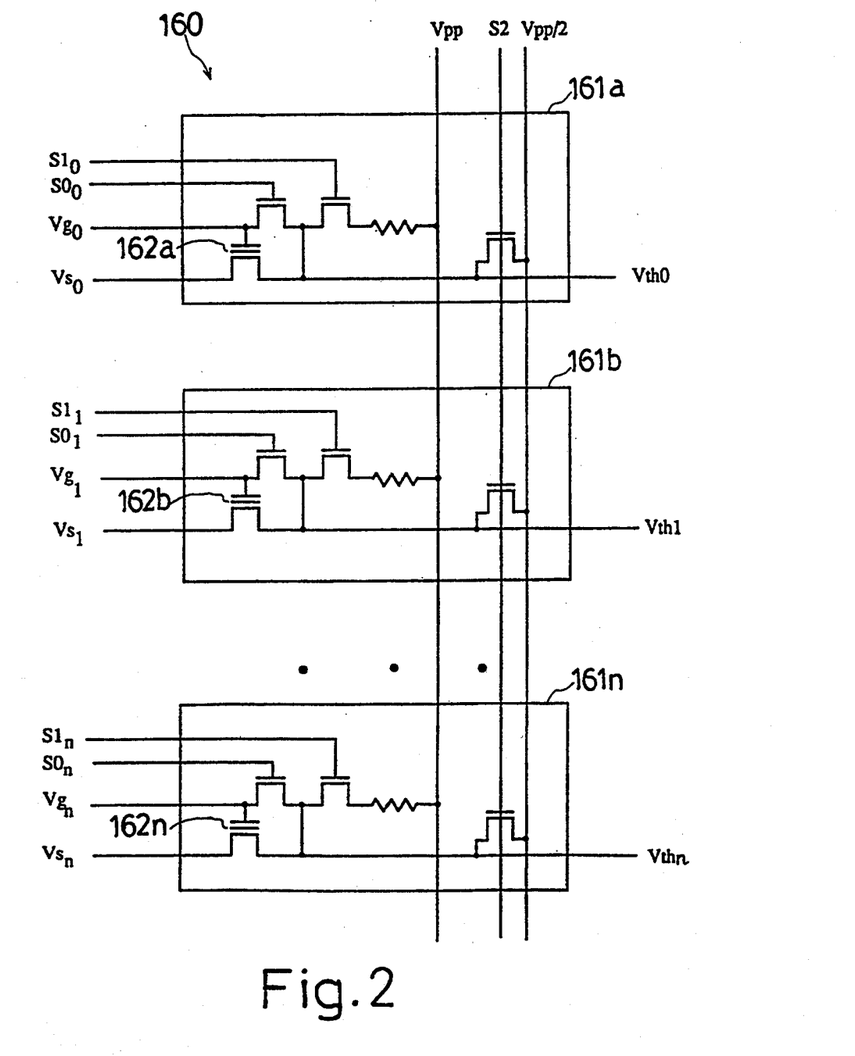
FIG. 2 is a circuit diagram of a weighting circuit shown in FIG. 1.

Further, coupled to a priority encoder 150 as part of the content addressable memory 100 is output lines of the weight memory circuits 161a, 161b, ..., 161n as well as the match lines 14a, 14b, ..., 14n. In the priority encoder 150, a match line having the maximum weight is regarded as the highest priority match line among the match lines on which the match signal given by a logic "1" appears, and an address AD associated with the highest priority match line is made up. The address AD is supplied, similar to the conventional example (see FIG. 6), to the address decoder 16, so that the data stored in the word memory associated with the address AD is read out onto the output register 18. FIG. 2 is a circuit diagram of a weighting circuit 160 shown in FIG. 1.

The weighting circuit 160 comprises a number of the weight memory circuits 161a, 161b, ..., 161n provided in conjunction with the match lines 14a, 14b, ..., 14n (see FIG. 1), respectively. The weight memory circuits 161a, 161b, ..., 161n comprise non-volatile memory cells 162a, 162b, ..., 162n and the associated accessory circuits as shown in the figure, respectively. Write and erase with respect to the weight memory circuits 161a, 161b, ..., 161n are performed through the control of signal lines as shown in the figure under Table 1, and there are provided waiting states for reading out of the thresholds of the respective non-volatile memory cells as Vth0, Vth1, ..., Vthn.

TABLE 1

| State | S0 | S1 | S2 | Vg | Vs |
|---|---|---|---|---|---|
| Write | 0 | 0 | $V_{dd}$ | $V_{pp}$ | 0 |
| Erase | 0 | 0 | 0 | $V_E$ | $V_{dd}$ |
| Wait | $V_{dd}$ | $V_{dd}$ | 0 | float | 0 |

In Table 1, there are omitted symbols for distinguishing the weight memory circuits 161a, 161b, ..., 161n from each other, and what is meant by "float" is a high impedance state. $V_{pp}$ and $V_E$ denote write voltage and erase voltage, respectively, which are determined on the basis of characteristics of the circuits.

The respective signal lines are controlled by the memory cell controller 170 (see in FIG. 1) as shown in Table 1. The memory cell controller 170 is obvious instructure for one skilled in the art, and thus its arrangement is not shown.

Figure 3:
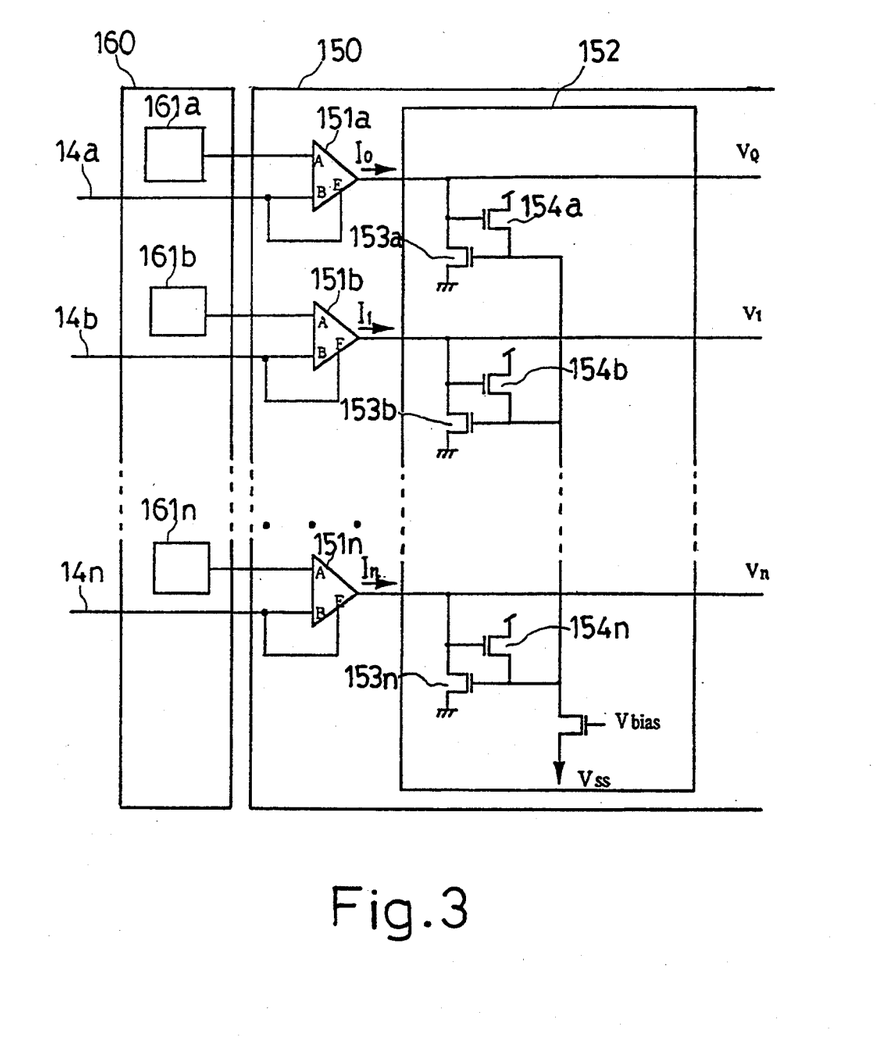
FIG. 3 is a circuit diagram of signal input portions of a priority encoder.

FIG. 3 is a circuit diagram of signal input portions of the priority encoder.

Connected to the respective input terminals A of operating units 151a, 151b, . . . , 151n as part of the priority encoder 150 are the respective output lines of the associated weight memory circuits 161a, 161b, . . . , 161n constituting the weight circuit 160, while connected to the respective input terminals B and enable terminals E of the operating units 151a, 151b, . . . , 151n are the associated match lines 14a, 14b, . . . , 14n, respectively. The operating units 151a, 151b, . . . , 151n each perform the following operation so as to generate currents $I_0, I_1, \ldots, I_n$:

$$I_i = k \cdot (V_B - V_A) + \alpha \text{ (when } V_B - V_A \geq 0)$$

$$I_i = 0 \text{ (when } V_B - V_A < 0)$$

where, i = 1 ~ n $V_A$: voltage signal from input terminal A
$V_B$: voltage signal from input terminal B
k, α: positive constant For example, assuming that the non-volatile memory cells 162a in the weight memory circuits 161a is subjected to erasing by once in the initial state (Vth0=5.0 V), and the threshold is varied to be 0.93 times as large as that before erasing through one erasing, a signal given with the threshold Vth0=4.65 V (0.93×5.0 V) is supplied to the operating unit 151a ($V_A$=4.65 V). On the other hand, if a match signal given with 5.0 V appears on the match lines 14a ($V_B$=5.0 V), an output currents $I_0$ of the operating unit 151a is $$I_0 = k \cdot (5.0 - 4.65) + \alpha$$
$$= 0.35k + \alpha$$

Further, for example, assuming that the non-volatile memory cells 162b in the weight memory circuits 161b is subjected to erasing twice in the initial state, the output voltage Vth1 is $$Vth1 = 0.93 \times 0.93 \times 5.0 = 4.32 \text{ (V)}$$

In addition, if a match signal given with 5.0 V appears on the retrieval coincidence lines 14b, an output currents $I_1$ of the operating unit 151b is $$I_1 = k \cdot (5.0 - 4.32) + \alpha$$
$$= 0.68k + \alpha.$$

Furthermore, if a mismatch signal given with 0 V appears on the match lines 14n, $V_B - V_A < 0$. Thus, an output currents $I_n$ of the operating unit 151b is $$I_n = 0$$

That is, magnitude of the output currents of the operating units 151a, 151b, . . . , 151n is proportional, in a case where the match signal (5.0 V) appears on the associated match lines 14a, 14b, . . . , 14n, to the number of times for erasing of the non-volatile memory cells 162a, 162b, . . . , 162n included in the weight memory circuits 161a, 161b, . . . , 161n, respectively, which are associated with the operating units 151a, 151b, . . . , 151n, respectively. On the other hand, in a case where the mismatch signal (0 V) appears on the associated match lines, no current is output (I=0). Therefore, the more the number of times for erasing and the lower the threshold of the non-volatile memory cell, the larger the weight.

The respective output lines of the operating units 151a, 151b, . . . , 151n are connected to a WTA (Winner-Take-All) circuit 152 constituting part of the priority encoder 150. The WTA circuit 152 comprises on each of the operating units 151a, 151b, . . . , 151n, as shown in FIG. 3, a pair of first transistors 153a, 153b, . . . , 153n and second transistors 154a, 154b, . . . , 154n. The WTA circuit 152 outputs a logic "1" signal (e.g. 2.8 V), of the supplied currents $I_0, I_1, \ldots, I_n$, only to the signal line involved in the maximum current (here supposing that it is $I_1$), and outputs a logic "0" signal to the other signal lines. The WTA circuit 152 causes the first transistors 153a, 153b, . . . , 153n to operate in an unsaturation region, so that a slight difference in current is converted into a large difference in voltage. Details of principles of the operation of the WTA circuit 152 is described in [Moses E. Robinson, Hideki Yoneda and Edgar Sanchez-Sinencio, "A MODULAR VLSI DESIGN OF A CMOS HAMMING NETWORK", Proc. INTERNATIONAL SYMPOSIUM CIRCUIT AND SYSTEMS, June, 1991.]

Figure 4:
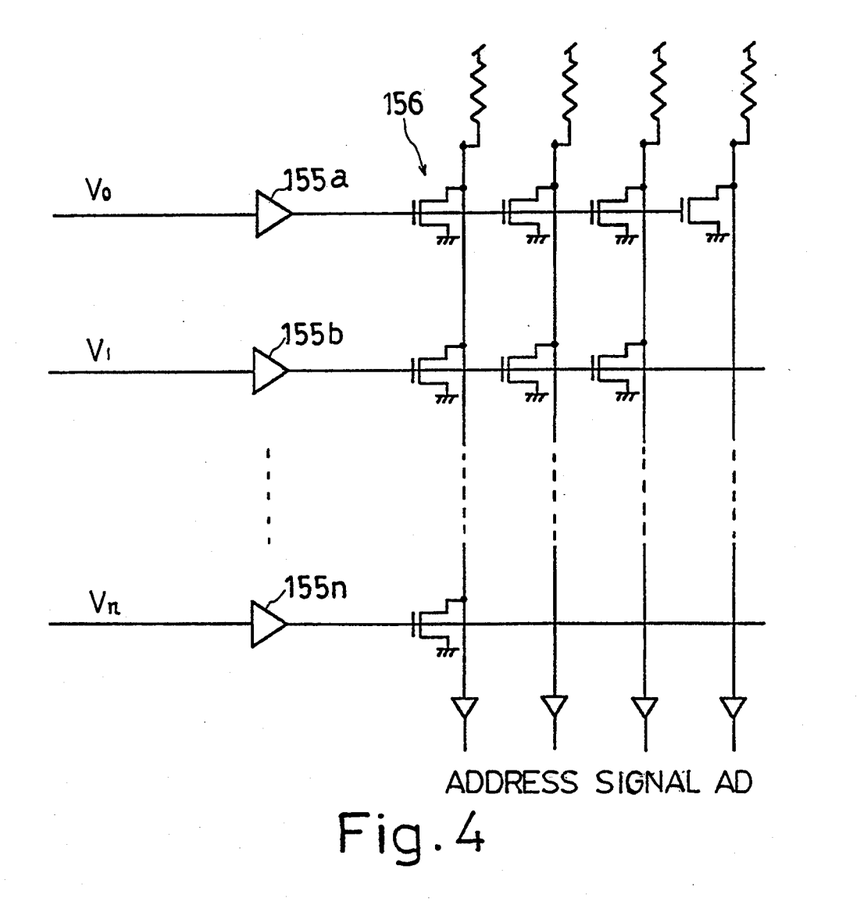
FIG. 4 is a circuit diagram of an address conversion unit constituting part of the priority encoder.

FIG. 4 is a circuit diagram of an address conversion unit constituting part of the priority encoder 150 (see FIG. 3). Even the output signals $V_0, V_1, \ldots, V_n$ of the WTA circuit 152 shown in FIG. 3 are of the logic "1", they will be of for example 2.8 V and thus low. Consequently, there are used sense amplifiers 155a, 155b, . . . , 155n to convert those output signals into ones each having a regular voltage as the logic "1" or the logic "0". An address conversion circuits 156 outputs mutually different address signals AD in accordance with the output signals from the sense amplifiers 155a, 155b, . . . , 155n. The thus generated address signal AD is applied to the address decoder 16 (FIG. 1), so that the storage content of the word memory associated with this address signal AD is read out onto the output register 18.

As described above, according to the present embodiment, the more the number of times for erasing of the non-volatile memory cells 162a, 162b, . . . , 162n, the larger the weight, and when a match signal appears on a plurality of match lines 14a, 14b, . . . , 14n, the WTA circuit is used to select a match line corresponding to the maximum weight as the highest priority match line. Thus, it is possible to read out the storage contents in order of weight.

Figure 5:
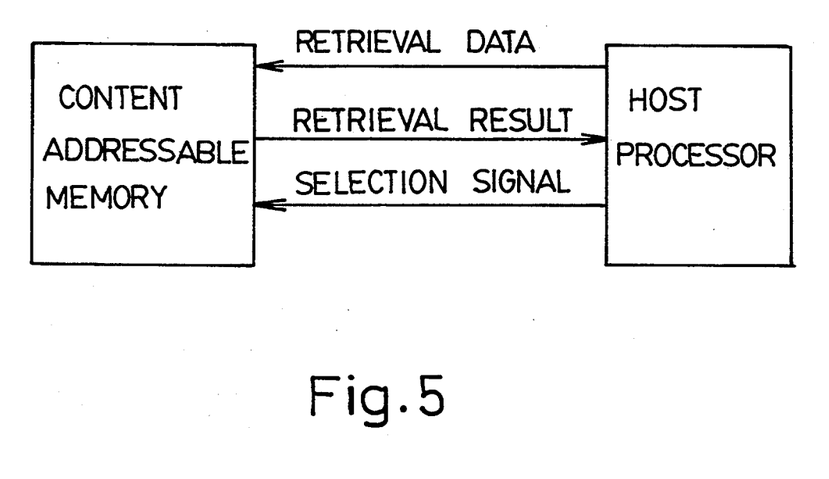
FIG. 5 is a view useful for understanding a method of the use of the content addressable memory according to the present invention by way of example.

FIG. 5 is a view useful for understanding a method of the use of the content addressable memory according to the present invention by way of example;

The system as shown in FIG. 5 makes it possible to perform a retrieval on the basis of weighting by the user such as order of frequency in use. The retrieval is performed in the following procedure.

(1) Initialization by Host Processor

All of the non-volatile memories have stored the logic "1".

Data to be retrieved have been loaded onto the content addressable memory.

(2) The host processor sends retrieval data to the content addressable memory.

(3) The content addressable memory outputs only one retrieval result to the output register 18 shown in FIG. 1 and sends back the retrieval result to the host processor. If a plurality of retrieval results occur, only one of them is output according to the characteristics of a WTA circuit.

(4) The user selects a desired retrieval result through the host processor. This selection may also be carried out by a program executed by the host processor. If the result is not a desired one, the host processor requests the content addressable memory to send the next retrieval result. If the retrieval result is a desired one, the host processor sends a teacher-signal to the content addressable memory.

(5) Upon receipt of the teacher-signal from the host processor, the content addressable memory performs erasing by unit time with respect to the non-volatile memory cell of the weight memory circuit associated the selected retrieval result, so that the threshold voltage is varied to provide a higher priority.

Thus, it is possible to implement a retrieval according to the frequency in use selected by the user.

The present invention is not limited to the particular embodiments described above. Various changes and modifications may be made within the spirit and scope of the invention.

I claim:

1. A content addressable memory comprising:
    a plurality of word memories each for storing digital data in units of words;
    a plurality of match lines, each of said plurality of match lines associated with a corresponding one of said plurality of word memories;
    a data retrieval circuit adapted to receive retrieval data and to output match signals to at least one of said plurality of match lines associated with word memories storing one of a bit pattern and a portion of a bit pattern similar to that of the retrieval data;
    a plurality of weight memory circuits, each of said plurality of weight memory circuits associated with a corresponding one of said plurality of match lines;
    a weight alteration circuit for selectively altering weights stored in said plurality of weight memory circuits in accordance with a predetermined teacher-signal; and
    a selection circuit for selecting a match line associated with a weight memory circuit having a maximum weight, if a match signal appears on more than one of said plurality of match lines.

2. A content addressable memory according to claim 1, wherein each of said plurality of weight memory circuits has a non-volatile memory cell associated with the corresponding one of said plurality of match lines, said weight alteration circuit selectively alters thresholds of the plurality of non-volatile memory cells, each of said thresholds representing a weight, and said selection circuit selects a match line associated with a non-volatile memory cell having a maximum weight, if the match signal appears on more than one of said plurality of match lines.

3. A content addressable memory according to claim 2, wherein said weight alteration circuit selectively performs an erase procedure on a unit time basis on arbitrary ones of said plurality of non-volatile memory cells which have been subjected to an initial writing procedure to establish a predetermined threshold level.

4. A method of using a content addressable memory comprising:
    a plurality of word memories, each of said plurality of word memories for storing digital data in units of words;
    a plurality of match lines, each of said plurality of match lines associated with a corresponding one of said plurality of word memories;
    a data retrieval circuit adapted to receive retrieval data and to output match signals to at least one of said plurality of match lines associated with word memories storing one of a bit pattern and a portion of bit pattern similar to that of the retrieval data;
    a plurality of weight memory circuits, each of said plurality of weight memory circuits associated with a corresponding one of said plurality of match lines;
    a weight alteration circuit for selectively altering weights stored in said plurality of weight memory circuits in accordance with a predetermined teacher-signal; and
    a selection circuit for selecting a match line associated with a weight memory circuit having a maximum weight, if a match signal appears on more than one of said plurality of match lines;
    wherein the method of using said content addressable memory comprises the steps of:
    inputting the retrieval data into said content addressable memory;
    receiving from said content addressable memory a first retrieval result corresponding to the retrieval data;
    requiring said content addressable memory to output a second retrieval result in a next sequence when the first retrieval result is not a desired retrieval result; and
    inputting the predetermined teacher-signal into said content addressable memory, when a retrieval result is the desired retrieval result, and causing a weight memory circuit associated with a word memory storing data corresponding to the desired retrieval result to store a second weight greater than a first weight stored in said weight memory circuit.

5. The content addressable memory of claim 1, wherein said weight alteration circuit alters a weight corresponding to a matched word based on a number of times the matched word is selected by a user.

6. The content addressable memory of claim 1, further comprising output means for outputting a word having the maximum weight in a set of retrieved words.

7. The method of claim 4, further comprising altering, with said weight alteration circuit, a weight corresponding to a matched word based on a number of times the matched word is selected by a user.

8. The method of claim 4, further comprising outputting, with said content addressable memory, a word having the maximum weight in a set of retrieved words.

* * * * *